(12) United States Patent  
Maekawa et al.

(10) Patent No.: US 7,709,955 B2
(45) Date of Patent: May 4, 2010

(54) SEMICONDUCTOR DEVICE WITH A LINE AND METHOD OF FABRICATION THEREOF

(75) Inventors: Kazuyoshi Maekawa, Hyogo (JP); Kenichi Mori, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 374 days.

(21) Appl. No.: 11/676,951

(22) Filed: Feb. 20, 2007

(65) Prior Publication Data

US 2007/0138532 A1   Jun. 21, 2007

Related U.S. Application Data

(62) Division of application No. 11/148,307, filed on Jun. 9, 2005, now Pat. No. 7,192,871.

(30) Foreign Application Priority Data

Jun. 10, 2004 (JP) ............................. 2004-172500
Jun. 6, 2005 (JP) ............................. 2005-165252

(51) Int. Cl.
H01L 23/48 (2006.01)

(52) U.S. Cl. .................. 257/758; 257/750; 257/751; 257/753; 257/761; 257/762; 257/763; 257/767; 257/773; 257/774

(58) Field of Classification Search ......... 257/750–753, 257/758, 761–763, 767, 773, 774
See application file for complete search history.

(56) References Cited

U.S. PATENT DOCUMENTS 6,033,990 A * 3/2000 Kishimoto et al. .......... 438/710

| 6,613,664 B2 | 9/2003 | Barth et al. |
| 2002/0109234 A1 | 8/2002 | Park et al. |

(Continued)

FOREIGN PATENT DOCUMENTS

| JP | 7-14836 | 1/1995 |
| JP | 2000-114261 | 4/2000 |
| JP | 2000-133711 | 5/2000 |
| JP | 2001-77195 | 3/2001 |
| JP | 2002-64138 | 2/2002 |

OTHER PUBLICATIONS

T.J. Dalton, et al., "A 90nm Dual Damascene Hybrid (Organic/Inorganic) Low-k-Copper BEOL Integration Scheme", Advanced Metallization Conference 2003, Materials Research Society, 2004, pp. 85-89.

*Primary Examiner*—Kevin M Picardat
*Assistant Examiner*—Bac H Au
(74) *Attorney, Agent, or Firm*—Oblon, Spivak, McClelland, Maier & Neustadt, L.L.P.

(57) ABSTRACT

A semiconductor device includes an interlayer insulation film, an underlying line provided in the interlayer insulation film, a liner film overlying the interlayer insulation film, an interlayer insulation film overlying the liner film. The underlying line has a lower hole and the liner film and the interlayer insulation film have an upper hole communicating with the lower hole, and the lower hole is larger in diameter than the upper hole. The semiconductor device further includes a conductive film provided at an internal wall surface of the lower hole, a barrier metal provided along an internal wall surface of the upper hole, and a Cu film filling the upper and lower holes. The conductive film contains a substance identical to a substance of the barrier metal. A highly reliable semiconductor device can thus be obtained.

11 Claims, 15 Drawing Sheets

U.S. PATENT DOCUMENTS

| | | |
|---|---|---|
| 2003/0003733 A1* | 1/2003 | Ohashi et al. ............... 438/689 |
| 2003/0087520 A1 | 5/2003 | Chen et al. |
| 2003/0100181 A1 | 5/2003 | Park et al. |
| 2003/0160331 A1 | 8/2003 | Fujisawa |
| 2003/0203615 A1 | 10/2003 | Denning et al. |
| 2005/0173799 A1* | 8/2005 | Jou et al. .................... 257/751 |

* cited by examiner

···STRUCTURE OF CONTACT 9a OF FIG. 14

···STRUCTURE OF CONTACT 9b OF FIG. 14

··· STRUCTURE OF CONTACT 9a OF FIG. 14

··· STRUCTURE OF CONTACT 9b OF FIG. 14

···STRUCTURE OF CONTACT 9a OF FIG. 14
···STRUCTURE OF CONTACT 9b OF FIG. 14

SEMICONDUCTOR DEVICE WITH A LINE AND METHOD OF FABRICATION THEREOF

CROSS REFERENCE TO RELATED APPLICATIONS

This application is a divisional of U.S. application Ser. No. 11/148,307 filed on Jun. 9, 2005, which claims priority to Japanese Patent Application No. 2004-172500 filed on Jun. 10, 2004 and Japanese Patent Application No. 2005-165252 filed on Jun. 6, 2005. The contents of each of these documents are incorporated herein by reference.

BACKGROUND OF THE INVENTION

1. Field of the Invention

The present invention relates generally to semiconductor devices and methods of fabrication thereof and particularly to highly reliable semiconductor devices and methods of fabrication thereof.

2. Description of the Background Art

As a material for a line for large scale integration circuits (LSIs), aluminum has conventionally been employed. However, as LSIs are increasingly microfabricated and operated more rapidly, aluminum is being replaced with copper (Cu), a material smaller in electrical resistance. Employing Cu as a material for a line for LSIs allows electrical resistance to be reduced and also the line to be microfabricated, and also allows LSIs to operate faster. Cu, however, is diffusible into insulation film. If Cu diffuses into insulation film, the line would be impaired in reliability. Furthermore, Cu reacts with plasma ions very slowly. As such, if etching is employed to form the line, sufficient productivity cannot be achieved.

To address these disadvantages in recent years a Cu line is formed in damascene. If typical damascene is employed to form a Cu line the line is formed as follows:

Initially an underlying line of Cu is covered with a liner film, an interlayer insulation film and an anti-reflection film deposited in layers. Subsequently, resist for forming a via hole is deposited on the anti-reflection film and typical photolithography and etching are employed to provide the interlayer insulation film with the via hole so that the via hole has a bottom having a bottom surface exposing the liner film. The resist for forming the via hole is then removed and thereafter resist for forming a trench is deposited on the anti-reflection film and in the via hole and typical photolithography and etching are employed to provide the interlayer insulation film with a trench. Then the resist for forming the trench and the anti-reflection film are removed and thereafter the liner film exposed at the bottom surface of the via hole is etched to expose the underlying line. Then a Cu oxide film of a surface of the underlying line exposed at the via hole's bottom surface, residue (or polymer) produced in etching the liner film, and the like are removed by performing argon (Ar) sputter etching, annealing in an ambient of hydrogen ($H_2$), a plasma process, wet-etching, or the like. Then, barrier metal is deposited on the via hole and trench's sidewall and bottom surfaces and the interlayer insulation film. Then, a thin Cu film serving as a film that shields plating is deposited on the barrier metal, and plating is employed to deposit a Cu film on the via hole and trench's sidewall and bottom surfaces, and the interlayer insulation film. Then, excessive Cu film and barrier metal on the interlayer insulation film is chemically mechanically polished and thus removed to complete the Cu line.

The Cu line thus obtained, however, is more breakable as voids are caused. More specifically, when high temperature is attained for example in a thermal treatment, an actual environment of use, or the like, thermal stress is caused between the interlayer insulation film and the Cu line. For a conventional Cu line, the underlying line's surface and the via hole's side wall are in contact with each other at a right angle, and a portion at which the underlying line's surface and the Cu line's bottom contact each other tends to experience concentrated thermal stress.

Furthermore in the via hole the Cu line passes a current, which passes through the portion at which the underlying line's surface and the Cu line's bottom contact each other, and flows to the underlying line, which has a larger area in cross section than the via hole. As such, the portion at which the underlying line's surface and the Cu line's bottom contact each other tends to experience a concentrated current.

Thus the portion at which the underlying line's surface and the Cu line's bottom tends to experience concentrated thermal stress and current. As such, the portion provides a point initially causing voids. For a conventional Cu line, the underlying line and the Cu line contact each other in a plane. As such, the lines mutually contact over an insufficient area, and the line is disadvantageously more breakable. Furthermore, between the Cu line and the underlying line there is a disadvantageously large electrical resistance.

To address this, a method of forming a line that allows a Cu line and an underlying line to mutually contact over an increased area is disclosed for example in Japanese Patent Laying-Open No. 2002-064138. As described in the document, the line is formed as follows:

On a first layer line of Cu a copper diffusion preventing insulation film is deposited and thereafter an interlayer insulation film is deposited. Subsequently on the interlayer insulation film a resist film is deposited and used as a mask to expose a surface of the first layer line by anisoptropically etching the interlayer insulation film and the copper diffusion preventing insulation film. Furthermore, the first layer line's exposed surface is further etched to form a contact hole having a bottom deeper than the first layer line's surface. Subsequently a barrier layer is deposited on the interlayer insulation film including the contact hole's interior. Subsequently, a tantalum (Ta) film is deposited on the barrier layer. Subsequently, the Ta film and barrier layer outside the contact hole is chemically mechanically polished and thus removed to form a plug on the first layer line.

In the method disclosed in the publication the interlayer insulation film and the first layer line are etched to form a hole which in turn has a plug introduced therein. As such, the plug has a bottom surface and a partial side surface in contact with the first layer line. More specifically, the plug and the first layer line can mutually contact stereoscopically and hence over an increased area.

Other than the above publication, for example Japanese Patent Laying-Open Nos. 2001-077195, 2000-114261, 07-014836 and 2000-133711 also disclose etching an interlayer insulation film and an underlying line to form a hole which is in turn provided therein with a conductive layer.

As disclosed in Japanese Patent Laying-Open No. 2002-064138, resist remaining in the hole and residue (or polymer) of the copper diffusion preventing insulation film are removed, and this requires that after the interlayer insulation film and the first layer line are etched the hole's interior be washed. However, the hole's interior is washed with a solution having a property dissolving Cu. As such, in the cleaning the hole the first layer liner is wet-etched. This results in the first layer line having a hole larger in diameter than that in the interlayer insulation film. In other words, the first layer line has a hole having an internal wall with a recess. At this recess the barrier layer and the Ta film are hardly deposited (or tend to be discontinuous). As such, the recess provides a point initially causing voids, which tend to increase electrical resistance and render the line more breakable. This results in a semiconductor device impaired in reliability.

SUMMARY OF THE INVENTION

The present invention contemplates a highly reliable semiconductor device and method of publication thereof.

The present semiconductor device includes a first insulation film, a line provided in the first insulation film, a second insulation film provided on the first insulation film, and a third insulation film provided on the second insulation film. The line or the line and the first insulation film has or have a lower hole, and the second insulation film and the third insulation film have an upper hole communicating with the lower hole, and the lower hole is larger in diameter than the upper hole. The semiconductor device further includes a lower conductive film provided at an internal wall surface of the lower hole, an upper conductive film provided along an internal wall surface of the upper hole, and a conductive film containing copper and filling the upper and lower holes. The lower conductive film contains a substance identical to that of the upper conductive film.

The present method of fabricating a semiconductor device includes the steps of: depositing on a first insulation film having a line formed therein a second insulation film and a third insulation film deposited in layers; providing the second and third insulation films with an upper hole reaching the line or the line and the first insulation film; wet-etching an interior of the upper hole to form in the line a lower hole larger in diameter than the upper hole; depositing an upper conductive film covering an inner wall surface of the upper hole and only a bottom of the lower hole; physically etching the upper conductive film present at the bottom of the lower hole to provide a lower conductive film on an inner wall surface of the lower hole; and depositing a conductive film containing copper and filling the upper and lower holes.

In accordance with the present semiconductor device and its fabrication method even if a lower hole is larger in diameter than an upper hole the lower hole can have an internal wall surface with a lower conductive film thereacross. The lower hole can thus be free of significant voids and the semiconductor device can be increased in reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter the present invention's embodiments will be described with reference to the drawings.

First Embodiment

Figure 1:
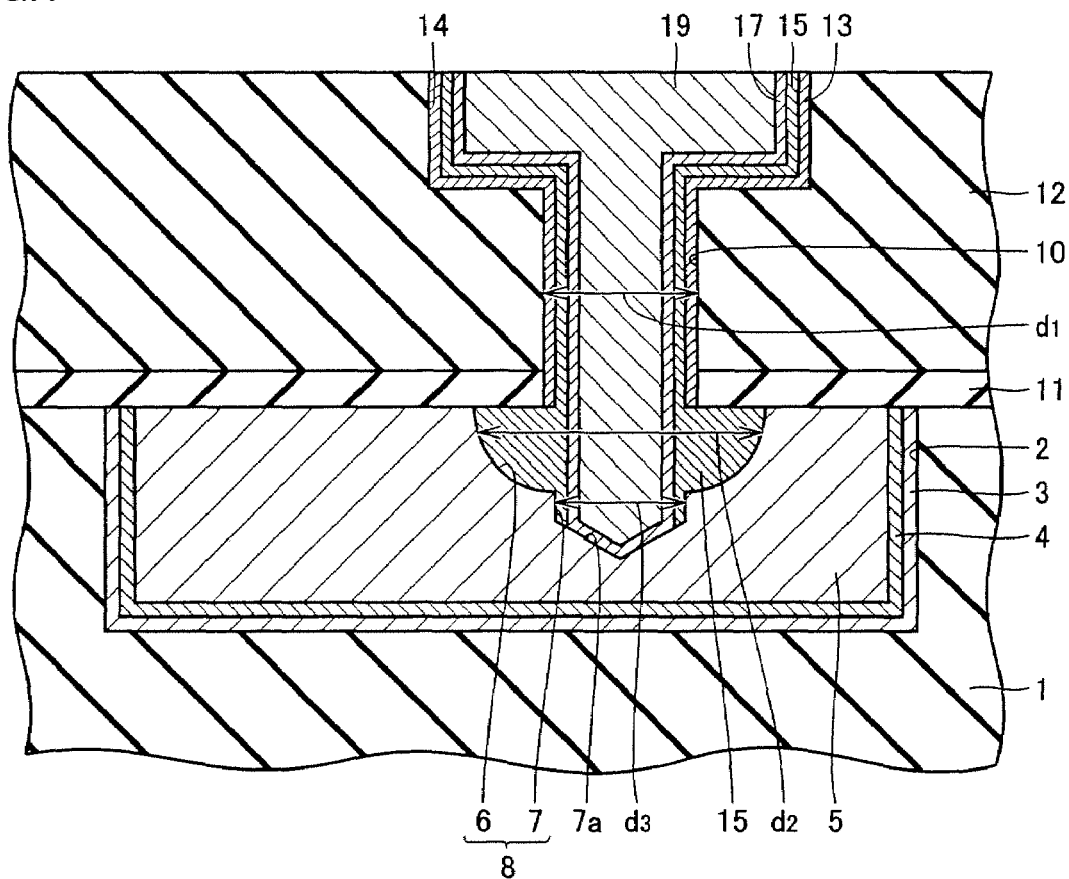
FIG. 1 is a cross section of a structure of a semiconductor device in a first embodiment of the present invention.

As shown in FIG. 1, the present embodiment provides a semiconductor device mainly including an interlayer insulation film 1 serving as a first insulation film, an underlying line 5 serving as a line, a liner film 11 serving as a second insulation film, and an interlayer insulation film 12 serving as a third insulation film. Interlayer insulation film 1 has a groove 2 formed therein, and along the groove's internal wall surface and bottom surface, barrier metals 3 and 4 are deposited in layers, and trench 2 is filled with underlying line 5 deposited on barrier metal 4. Underlying line 5 is covered with liner film 11 and interlayer insulation film 12 deposited on interlayer insulation film 1 in layers. Liner film 11 serves to prevent Cu contained in underlying line 5 from diffusing into interlayer insulation film 12. Furthermore, it also serves as an etching stopper in forming an upper hole 10 described later.

Interlayer insulation film 12 has a trench 14. Furthermore, through the interlayer insulation film 12 trench 14 and liner film 11, upper hole 10 is provided. Furthermore, underlying line 5 is provided with a lower hole 8. Upper hole 10 and lower hole 8 communicate with each other. Lower hole 8 has a hole 6 and a dug portion 7. Hole 6 has a semi-circular cross section. Hole 6 in a vicinity of a boarder between upper and lower holes 10 and 8, i.e., between liner film 11 and underlying line 5, has a diameter $d_2$ larger than a diameter $d_1$ of upper hole 10. Hole 6 has a bottom with dug portion 7 forming a portion of lower hole 8. Dug portion 7 has a diameter $d_3$ smaller than the hole 6 diameter $d_2$ and the upper hole 10 diameter $d_1$. Dug portion 7 has a bottom 7a in the form for example of a cone a hemisphere or the like.

Furthermore in the present embodiment the semiconductor device further includes a conductive film 15 provided across an internal wall surface of lower hole 8 and serving as a lower conductive film, a barrier metal 13 provided along an internal wall surface of upper hole 10 and serving as an upper conductive film, a Cu film 19 filling upper and lower holes 10 and 8, and a barrier metal 17.

Barrier metal 13 is provided along an internal wall surface of trench 14 and that of upper hole 10. Barrier metal 13 interrupts at the boarder between upper and lower holes 10 and 8. In lower hole 8, conductive film 15 is introduced to cover the entire internal wall surface of lower hole 8. Conductive film 15 is not introduced into dug portion 7 at bottom 7a. Conductive film 15 contains a substance identical to a substance of barrier metal 13 and underlying line 5. Note that while in FIG. 1 conductive film 15 is also provided in trench 14 and upper hole 10 on barrier metal 13, conductive film 15 provided at least across the entire internal wall surface of lower hole 8 suffices. On conductive film 15 in trench 14 and upper and lower holes 10 and 8 barrier metal 17 is deposited and thereon Cu film 19 is deposited to fill trench 14 and upper and lower holes 10 and 8. Note that in the present semiconductor device upper hole 10 has an internal wall surface provided with a layer A (in FIG. 1, barrier metal 13, conductive film 15 and barrier metal 17), and dug portions 7 has an internal wall surface provided with a layer B (in FIG. 1, conductive film 15 and barrier metal 17) and bottom 7a provided with a layer C (in FIG. 1, barrier metal 17) such that a relationship A≧B≧C is established in thickness or number.

Note that liner film 11 is formed for example of SiCN, SiCO, SiC, or the like. Interlayer insulation film 12 is formed for example of tetra ethyl ortho silicate (TEOS), $SiO_2$, SiOC, or the like. Barrier metal 3 is formed for example of TaN and barrier metal 4 and 17 is formed for example of Ta. Underlying line 5 is formed for example of Cu. Furthermore, barrier metal 13 is formed of film of at least one type selected from the group consisting of tantalum nitride, tantalum silicide, tantalum carbide, titanium nitride, titanium silicide, titanium carbide, tungsten nitride, tungsten silicide, tungsten carbide, ruthenium (Ru), and ruthenium oxide.

In the present embodiment's semiconductor device, underlying line 5 is etched to form lower hole 8, and conductive films such as Cu film 19, barrier metal 17 and conductive film 15 are provided in lower hole 8. Thus lower hole 3 is internally provided with a conductive film having a bottom surface and a partial side surface in contact with underlying line 5. More specifically, lower hole 8 is internally provided with a conductive film contacting underlying line 5 stereoscopically and hence over an increased area. This can alleviate thermal stress and a current otherwise concentrated at a portion at which a surface of underlying line 5 and a bottom of the conductive film in lower hole 8 contact each other. This can contribute to reduced voids and the line can be less breakable. Furthermore, it can also reduce electrical resistance between Cu film 19 and underlying line 5.

In the present embodiment the semiconductor device is fabricated in a method as will now be described hereinafter.

Figure 2:
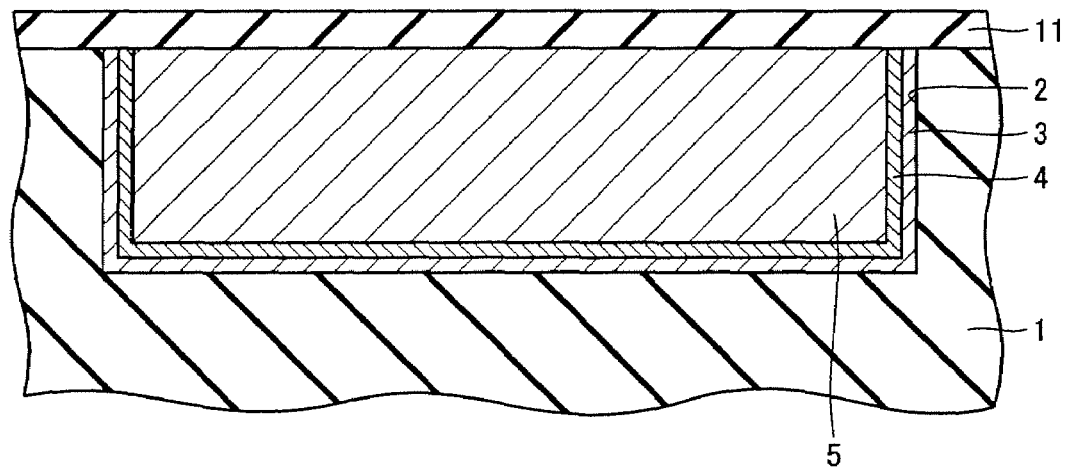
FIG. 2 is a cross section for illustrating a first step of a method of fabricating the semiconductor device in the first embodiment of the present invention.

With reference to FIG. 2, interlayer insulation film 1 is provided therein with groove 2. Then on interlayer insulation film 1 and in groove 2 on an internal wall surface and a bottom surface, chemical vapor deposition (CVD), sputtering or the like is employed to deposit barrier metals 3 and 4 in layers. Then to fill groove 2 and cover interlayer insulation film 1, CVD, plating or the like is employed to deposit a conductive film which will serve as underling line 5. Then, excessive barrier metal 3 and 4 on interlayer insulation film 1, and excessive conductive film are chemically mechanically polished and thus removed. Thus underlying line 5 is provided internal to interlayer insulation film 1. Then, underlying line 5 is covered with liner film 11 deposited on interlayer insulation film 1.

Figure 3:
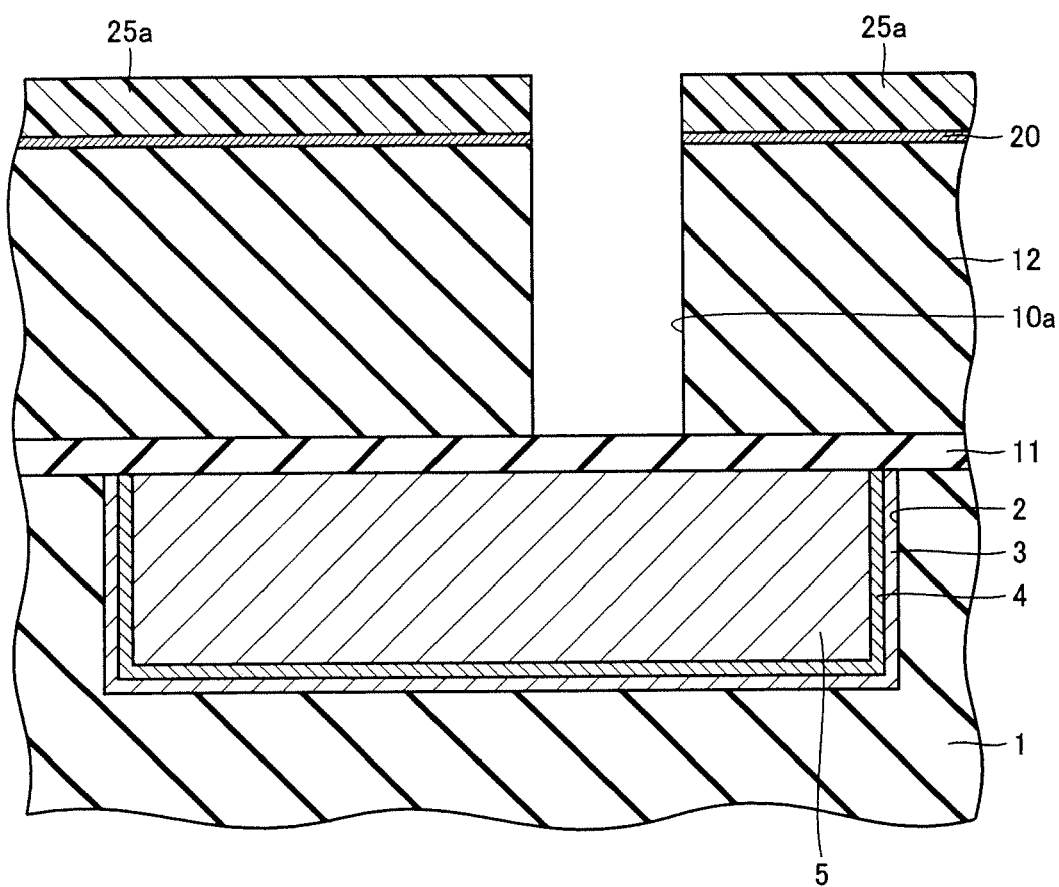
FIGS. 3-10 are cross sections for illustrating in an order of steps of the method of fabricating the semiconductor device in the first embodiment of the present invention.

With reference to FIG. 3, on liner film 11 interlayer insulation film 12 and an anti-reflective layer (ARL) 20 are deposited in layers. Then, a patterned resist 25a is deposited on anti-reflective layer 20 and used as a mask for etching anti-reflective layer 20 and interlayer insulation film 12 to form a hole 10a, which is a portion of upper hole 10. Hole 10a has a bottom exposing liner film 11.

Figure 4:
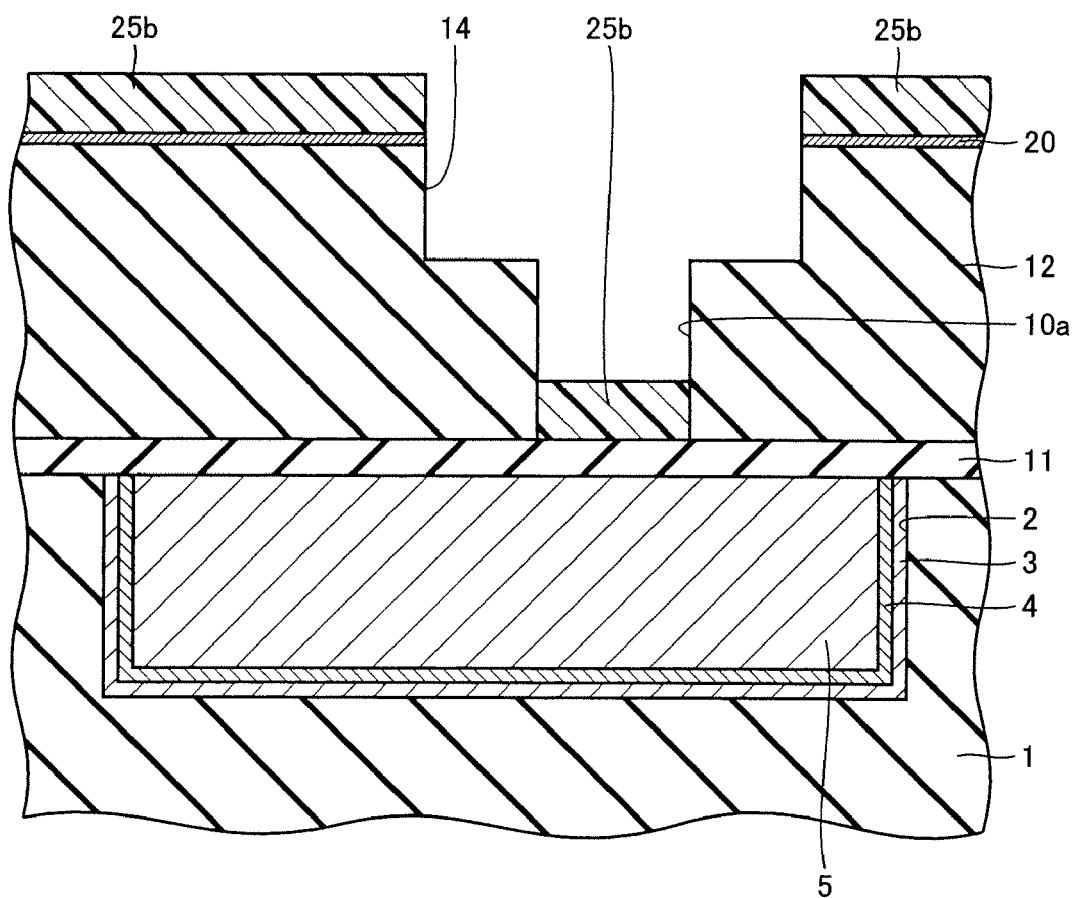

With reference to FIG. 4, resist 25a is removed and thereafter a patterned resist 25b is provided on interlayer insulation film 12 and in hole 10a. Then, resist 25b is used as a mask for etching anti-reflective layer 20 and interlayer insulation film 21 to form trench 14.

Figure 5:
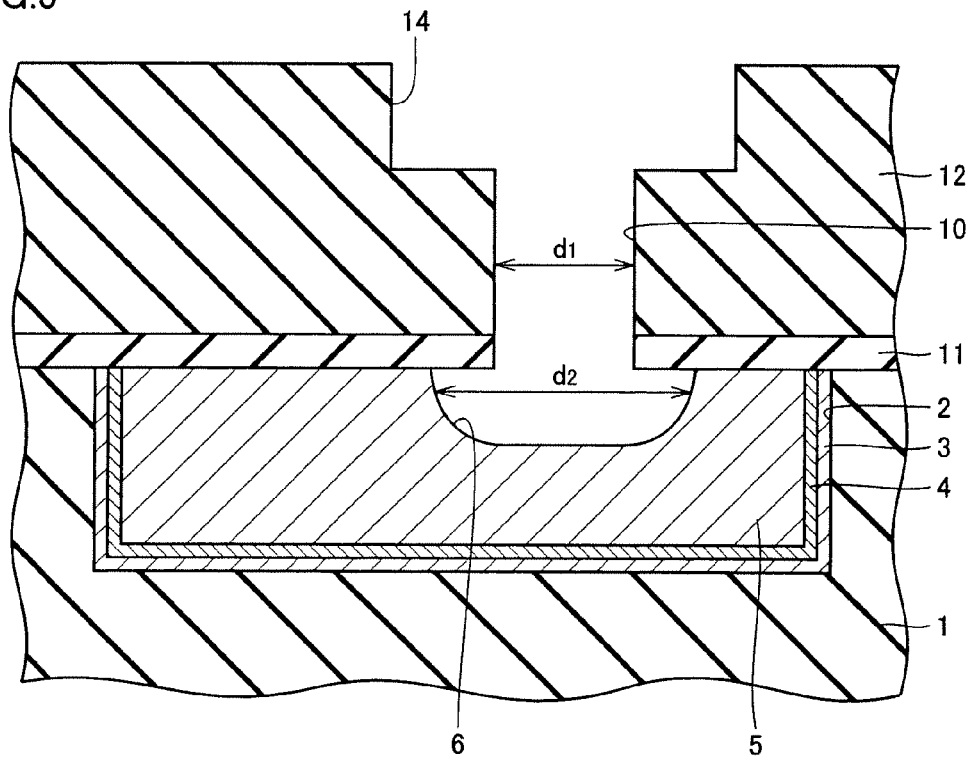

With reference to FIG. 5, resist 25b and anti-reflective layer 20 are removed and thereafter liner film 11 exposed at the bottom of hole 10a is etched away to provide interlayer insulation film 12 and line film 11 is provided with upper hole 10. Note that liner film 11 may not be completely be removed in forming upper hole 10. Furthermore, liner film 11 is etched such that underlying line 5 exposed at the bottom of upper hole 10 is not etched. Upper hole 10 thus formed has residue of resist 25b, that (or polymer) of liner film 11 remaining therein. To remove the residues, upper hole 10 then has its interior wet etched. Furthermore, if necessary, in addition to wet etching, sputter-etching using argon (Ar) gas, a helium (He)—Ar gaseous mixture or the like, annealing performed in an ambient containing hydrogen (H2) of several to 100% (for example at 100° C. to 350° C. for 10 to 180 seconds), a (remote) plasma process, or the like may be performed.

Note that wet etching has a nature allowing a substance to be isotropically etched. As such, when upper hole 10 is internally wet-etched, together with the residues, underlying line 5 is also etched and hole 6 having a semi-circular cross section results. Hole 6 in a vicinity of a boarder between liner film 11 and underlying line 5 has diameter $d_2$ larger than diameter $d_1$ of upper hole 10. In other words, hole 6 has an internal wall surface removed to be radially outer than that of upper hole 10 (in FIG. 5, in the lateral direction).

Figure 6:
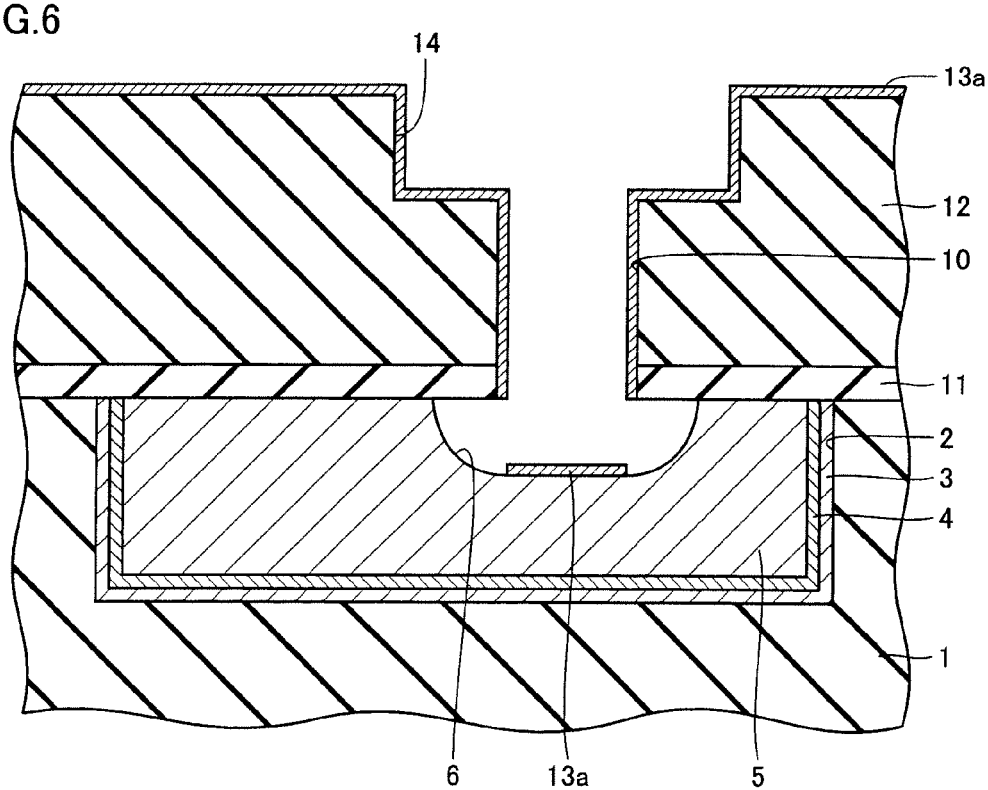

With reference to FIG. 6, for example sputtering, CVD or the like is employed to provide a conductive film 13a, which will serve as barrier metal 13, to cover an inner wall surface of upper hole 10 and only a bottom of hole 6. As has been described previously, hole 6 has an inner wall surface removed to be radially outer than that of upper hole 10 so that the hole has the inner wall surface free of conductive film 13a. Conductive film 13a is provided for example by the following method:

Initially a wafer is introduced into a load lock chamber in a CVD apparatus, a sputtering apparatus or similar film deposition apparatus and the chamber is vacuumed. Then in the vacuum the wafer is heated to a temperature of at least 100° C. and at most 400° C. to remove water or the like on a surface of the wafer. Then at −50° C. to −300° C. conductive film 13a is deposited to have a thickness of approximately 0.5 nm to 50 nm.

Figure 7:
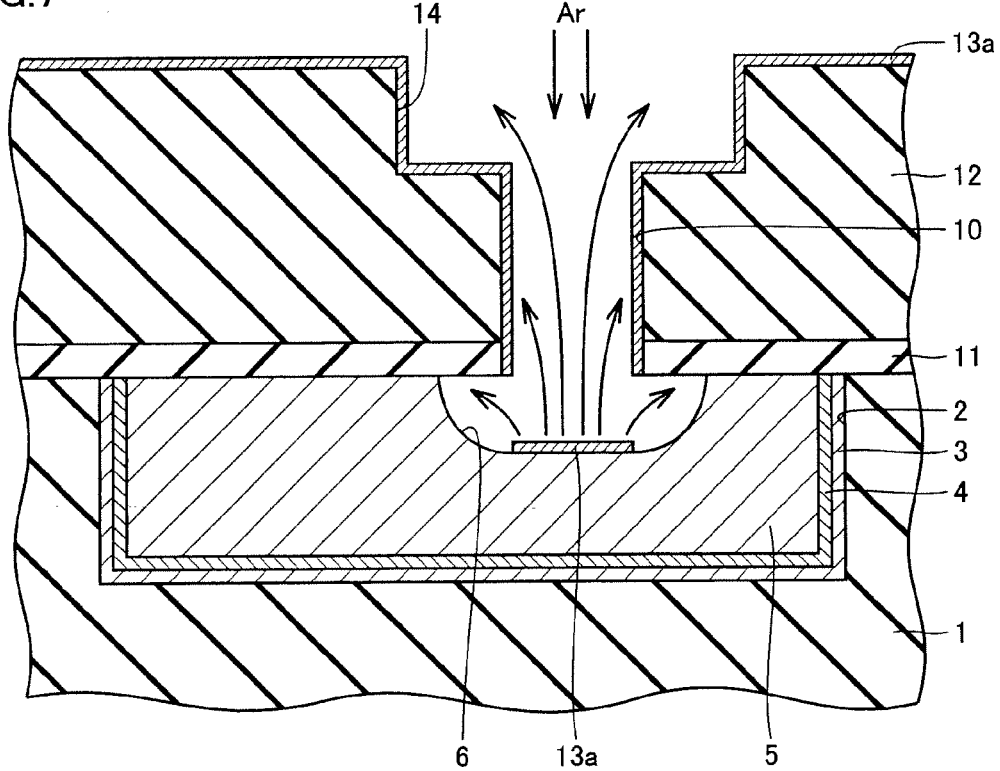
Figure 9:
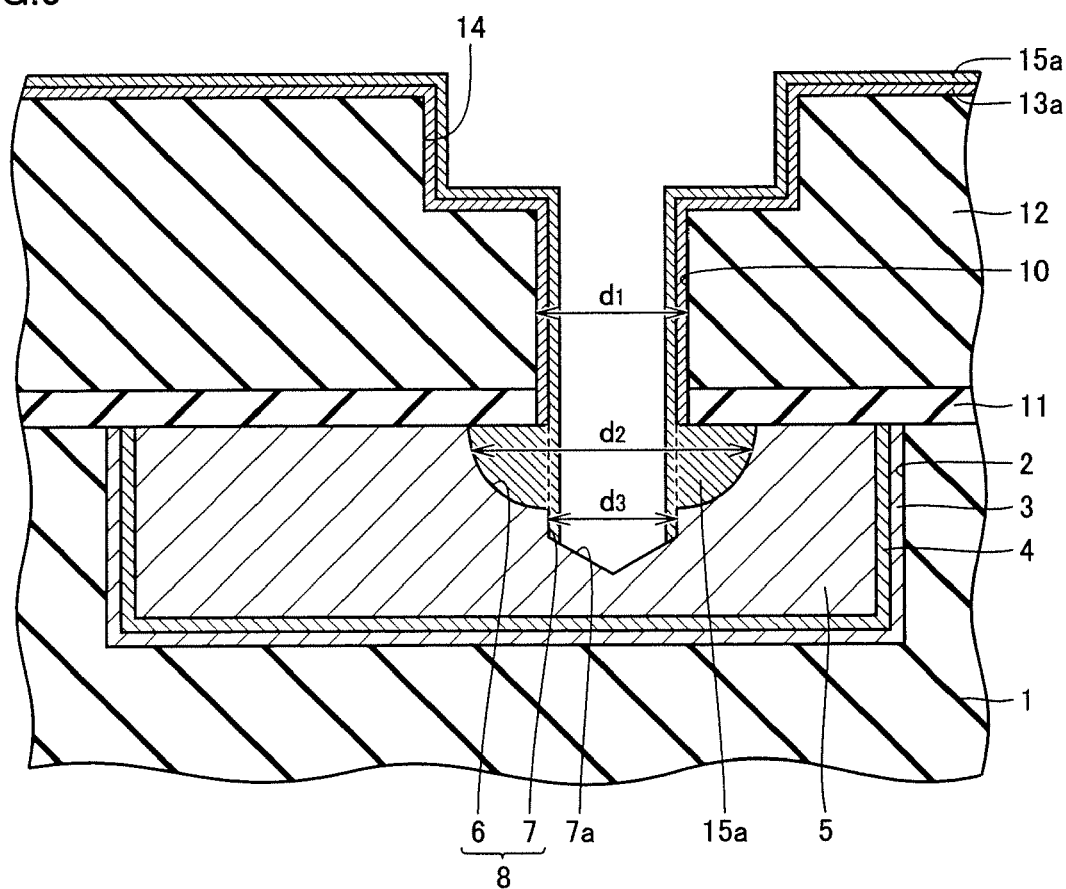

With reference to FIG. 7, conductive film 13a present at a bottom of hole 6 is physically etched and thus scattered to the hole's internal wall surface to deposit a conductive film 15a across the entirety of the surface (FIG. 9). Conductive film 15a contains a substance identical to a substance of conductive film 13a. Note that conductive film 13a may be scattered to the trench 14 internal wall surface and upper than interlayer insulation film 12 to provide conductive film 15a on the trench's internal wall surface and over interlayer insulation film 12.

Conductive film 13a is physically etched for example by sputter-etching using Ar, resputtering using sputter particles by bias sputter, or the like. Preferably, conductive film 13a is physically etched under such a condition that the hole 6 bottom is etched at a rate faster than the trench 14 and hole 6 internal wall surfaces are etched. Furthermore, sputtering small in vertical component (or directivity) and the above sputter etching may simultaneously be performed.

Figure 8:
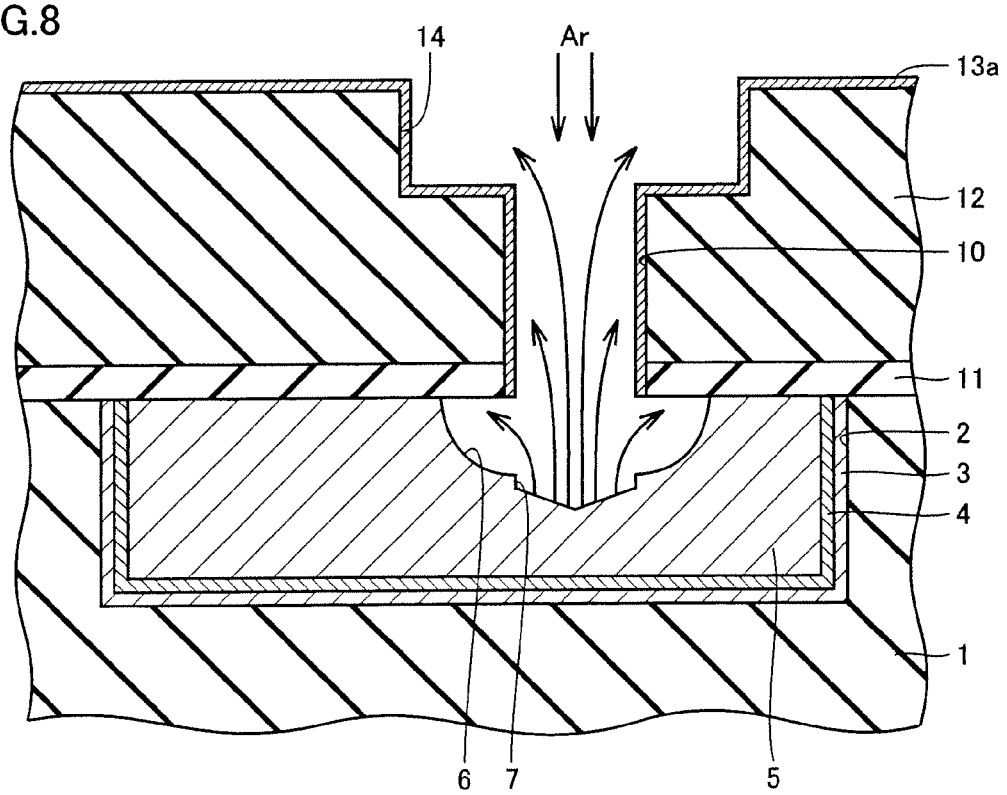

With reference to FIG. 8, after conductive film 13a present at the bottom of hole 6 is completely etched, underlying line 5 present at the bottom of hole 6 is physically etched and thus partially scattered toward the hole 6 internal wall surface to form dug portion 7 at the bottom of hole 6. Conductive film 15a provided across the entire internal wall surface of hole 6 further contains a substance identical to a substance of underlying line 5. Note that underlying line 5 may partially be scattered to the trench 14 internal wall surface and upper than interlayer insulation film 12 to provide conductive film 15a on the trench 14 internal wall surface and over interlayer insulation film 12. When conductive film 15a is provided on the trench 14 internal wall surface and over interlayer insulation film 12, conductive film 13a serves as barrier metal and prevents Cu contained in conductive film 15a from diffusing into liner film 11 and interlayer insulation film 12. Preferably, underlying line 5 existing at the bottom of hole 6 is etched at least one fourth or 30 nm in thickness.

With reference to FIG. 9, after the etching, hole 6 having an internal wall surface removed to be radially outer than that of upper hole 10 has its internal wall surface entirely filled with conductive film 15a. Furthermore, as dug portion 7 is formed by etching through upper hole 10, dug portion 7 has diameter $d_3$ smaller than diameter $d_1$ of upper hole 10 and substantially equal to that of upper hole 10 provided with conductive film 13a. Furthermore, between hole 6 and dug portion 7 a step results. Note that a portion closer to an internal wall surface of dug portion 7 is less exposed to ions and thus less etched. Accordingly, dug portion 7 has bottom 7a in the form for example of a cone, a hemisphere, or the like.

Figure 10:
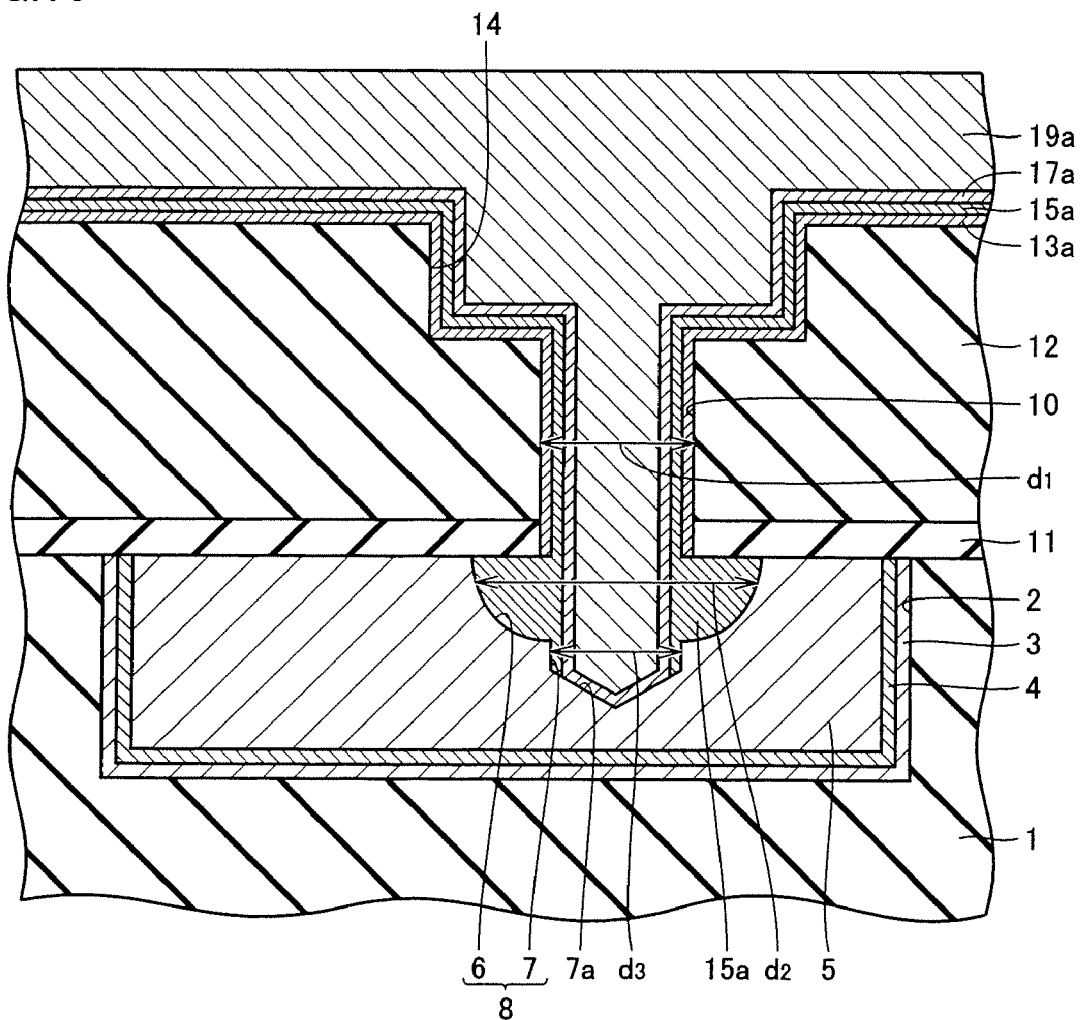

With reference to FIG. 10, for example, sputtering, CVD or the like is employed to deposit a conductive film 17a, which will serve as barrier metal 17, on conductive film 15a to have a thickness of 0.5 nm to 50 nm. Note that conductive film 17a may be identical in material to conductive film 15a. Then, a seed film of Cu (not shown) is deposited on conductive film 17a and a Cu film 19a is subsequently deposited to fill trench 14 and upper and lower holes 10 and 8. Cu film 19a is deposited for example by CVD, plating or the like.

With reference to FIG. 1, subsequently on interlayer insulation film 12 excessive conductive films 13a, 15a, 17a and Cu film 19a are chemically mechanically polished and thus removed to provide barrier metal 13, conductive film 15, barrier metal 17 and CU film 19. Thus the present embodiment's semiconductor device completes.

The present embodiment's semiconductor device includes interlayer insulation film 1, underlying line 5 provided in interlayer insulation film 1, liner film 11 overlying interlayer insulation film 1, and interlayer insulation film 12 overlying liner film 11. Underlying line 5 has lower hole 8 and liner film 11 and interlayer insulation film 12 have upper hole 10 communicating with lower hole 8 and lower hole 8 has diameter $d_2$ larger than the upper hole's diameter $d_1$. Furthermore, the semiconductor device includes conductive film 15 provided on an internal wall surface of lower hole 8, barrier metal 13 provided along an internal wall surface of upper hole 10, and Cu film 19 filling upper and lower holes 10 and 8. Conductive film 15 contains a substance identical to a substance of barrier metal 13.

In the present embodiment the semiconductor device is fabricated in a method including the following steps: On interlayer insulation film 1 having underlying line 5 therein liner film 11 and interlayer insulation film 12 are deposited in layers. Upper hole 10 reaching underlying line 5 is provided through liner film 11 and interlayer insulation film 12. Upper hole 10 is internally wet etched to form in underlying line 5 hole 6 having diameter $d_2$ larger than diameter $d_1$ of upper hole 10. Conductive film 13a is provided to cover an internal wall surface of upper hole 10 and only a bottom of hole 6. Conductive film 13a present at the bottom of hole 6 is physically etched to provide conductive film 15 on an inner wall surface of lower hole 8. Upper and lower holes 10 and 8 are filled with Cu film 19.

In the present embodiment's semiconductor device and its fabrication method conductive film 13a present at the bottom of hole 6 can physically be etched and thus provided as conductive film 15 on an inner wall surface of lower hole 8. As such, even if lower hole 8 has diameter $d_2$ larger than diameter $d_1$ of upper hole 10, lower hole 8 can have reduced voids, and the semiconductor device can be increased in reliability.

In the present embodiment's semiconductor device conductive film 15 further contains a substance identical to a substance of underlying line 5.

In the present embodiment's semiconductor device and its fabrication method conductive film 15 is provided by physically etching conductive film 13a and underlying line 5 present at a bottom of hole 6.

Thus conductive film 13a and underlying line 5 can be scattered to provide conductive film 15 having a large thickness on an internal wall surface of lower hole 8. This ensures that conductive film 15 is provided on the internal wall surface of lower hole 8 if underlying line 5 is significantly wet etched.

In the present embodiment's semiconductor device conductive film 15 is not provided in lower hole 8 at bottom 7a. Thus at the lower hole 8 bottom 7a Cu film 19 and underlying line 5 are provided with barrier metal 17 alone posed therebetween. As such, reduced electrical resistance can be achieved between Cu film 19 and lower line 5.

In the present embodiment's semiconductor device barrier metal 13 is a film of at least one selected from the group consisting of tantalum nitride, tantalum silicide, tantalum carbide, titanium nitride, titanium silicide, titanium carbide, tungsten nitride, tungsten silicide, tungsten carbide, ruthenium (Ru), and ruthenium oxide.

Thus barrier metal 13 can effectively prevent Cu contained in conductive film 15, CU film 19, and the like from diffusing into liner film 11 and interlayer insulation film 12.

While in the present embodiment in physically etching conducting film 13a underlying line 5 is also etched, the present invention is not limited thereto, and at least physically etching conductive film 13a suffices.

Second Embodiment

Figure 11:
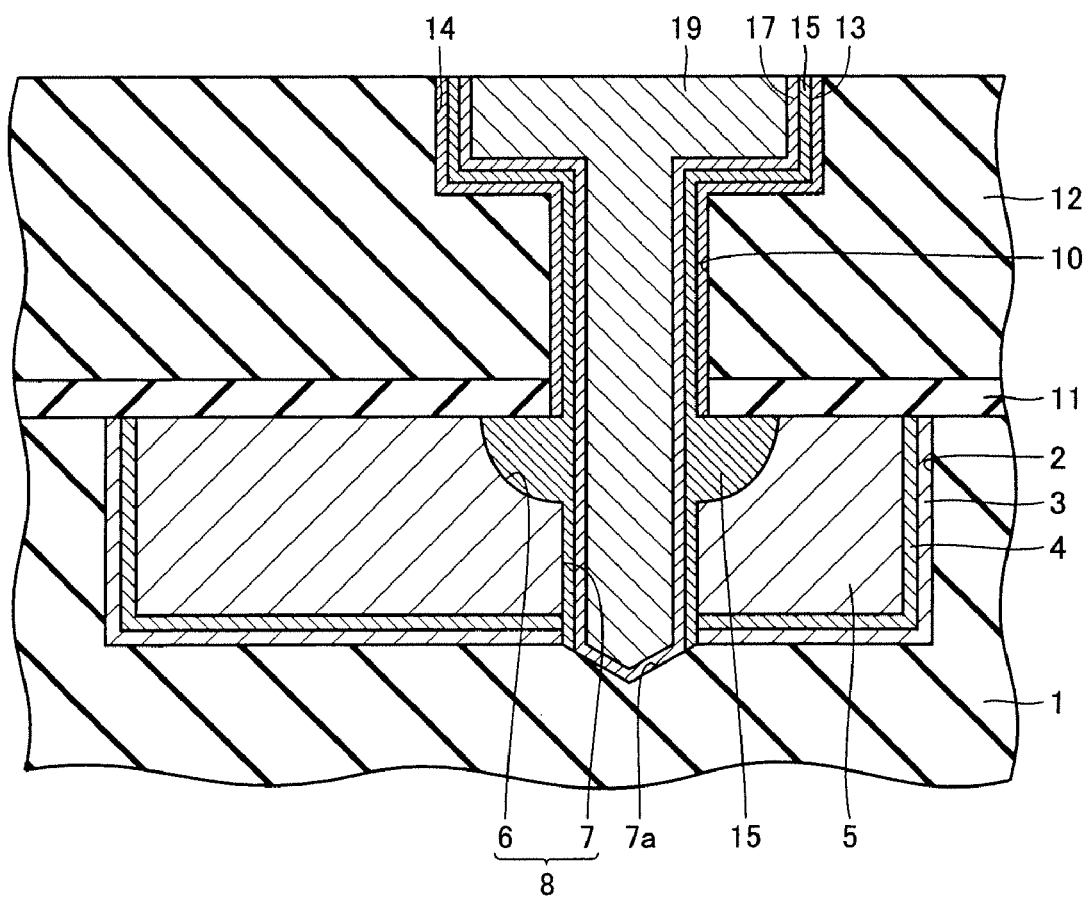
FIGS. 11 and 12 are cross sections of structures of semiconductor devices in second and third embodiments, respectively, of the present invention.

With reference to FIG. 11, the present embodiment provides a semiconductor device different from that of the first embodiment of the present invention shown in FIG. 1 in that lower hole 8 has dug portion 7 penetrating underlying line 5. Such structure is obtained by performing physical etching in providing conductive film 15a, as shown in FIG. 8, until underlying line 5 is penetrated.

Other than the above, the semiconductor device's structure and its fabrication method are substantially similar to those of the first embodiment of the present invention shown in FIGS. 1-10. Accordingly, identical components are identically denoted and will not be described.

In the present embodiment the semiconductor device has lower hole 8 penetrating underlying line 5.

In the present embodiment's semiconductor device fabrication method, when conductive film 15a is provided, physical etching is performed until underlying line 5 is penetrated.

A portion at which the lower hole 8 bottom and underlying line 5 contact each other causes voids more readily than other portions. The present embodiment's semiconductor device and its fabrication method ensure electrical connection between Cu film 19 and underlying line 5 at a portion at which an inner wall of lower hole 8 and underlying line 5 contact each other. As such, if the portion at which the lower hole 8 bottom and underlying line 5 contact each other has voids, the electrical connection between Cu film 19 and underlying line 5 is not affected, and the semiconductor device can thus have high reliability.

Third Embodiment

Figure 12:
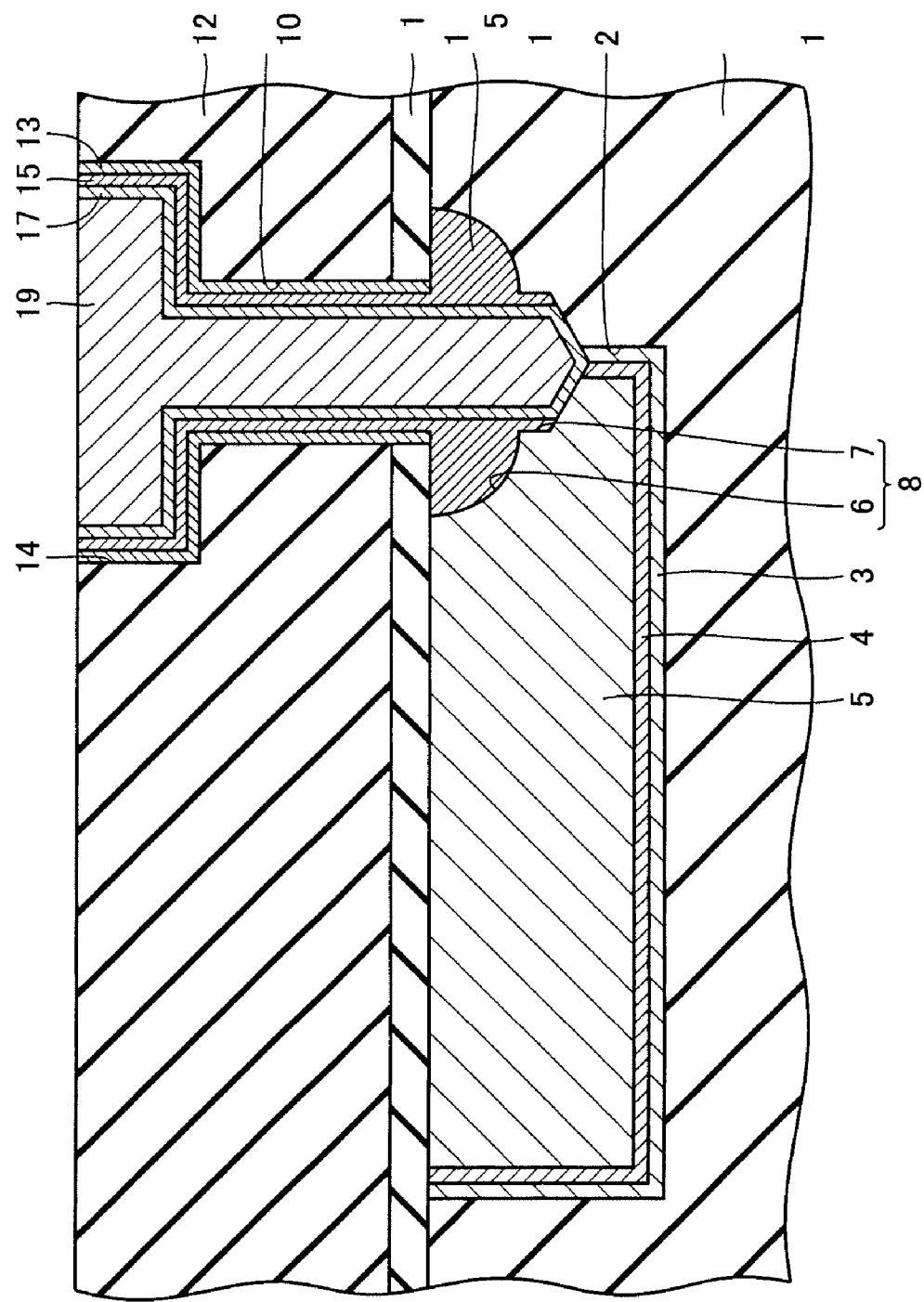

With reference to FIG. 12, the present embodiment provides a semiconductor device different from that in the first embodiment of the present invention shown in FIG. 1 in that lower hole 8 is located in interlayer insulation film 1 and underlying line 5. Such structure can be obtained in forming upper hole 10, as shown in FIG. 5, by forming upper hole 10 reaching interlayer insulation film 1 and underlying line 5.

Other than the above, the semiconductor device's structure and its fabrication method are substantially similar to those of the first embodiment of the present invention shown in FIGS. 1-10. Accordingly, identical members are identically denoted and will not be described.

In the present embodiment's semiconductor device lower hole 8 is located in interlayer insulation film 1 and underlying line 5.

In the present embodiment's semiconductor fabrication method upper hole 10 is provided to reach underlying line 5 and interlayer insulation film 1.

In the semiconductor device fabrication process when upper hole 10 is provided the hole may be displaced from exactly above underlying line 5, as shown in FIG. 12, as resist is displaced or the like. In the present embodiment's semiconductor device and its fabrication method if upper hole 10 is positionally displaced, a portion at which a conductive film provided in lower hole 8 and underlying line 5 contact each other can be ensured. As a result, the semiconductor device's reliability can be increased and electrical resistance between Cu film 19 and underlying line 5 can be reduced.

Figure 13:
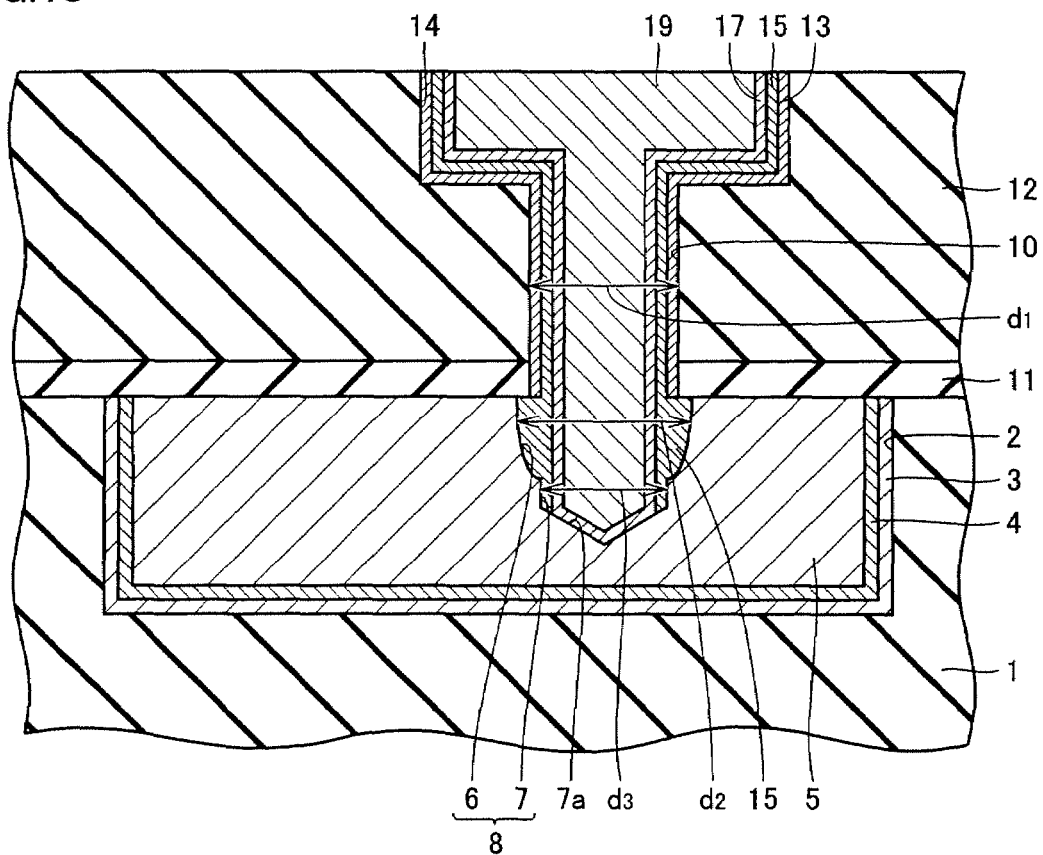
FIG. 13 is a cross section of a structure in an exemplary variation of the semiconductor device in the first to third embodiments of the present invention.

While in the first to third embodiments hole 6 has diameter $d_2$ significantly larger than diameter $d_1$ of upper hole 10, the present semiconductor device may have hole 6 with diameter $d_2$ slightly larger than diameter $d_1$ of upper hole 10, as shown in FIG. 13.

Fourth Embodiment

Figure 14:
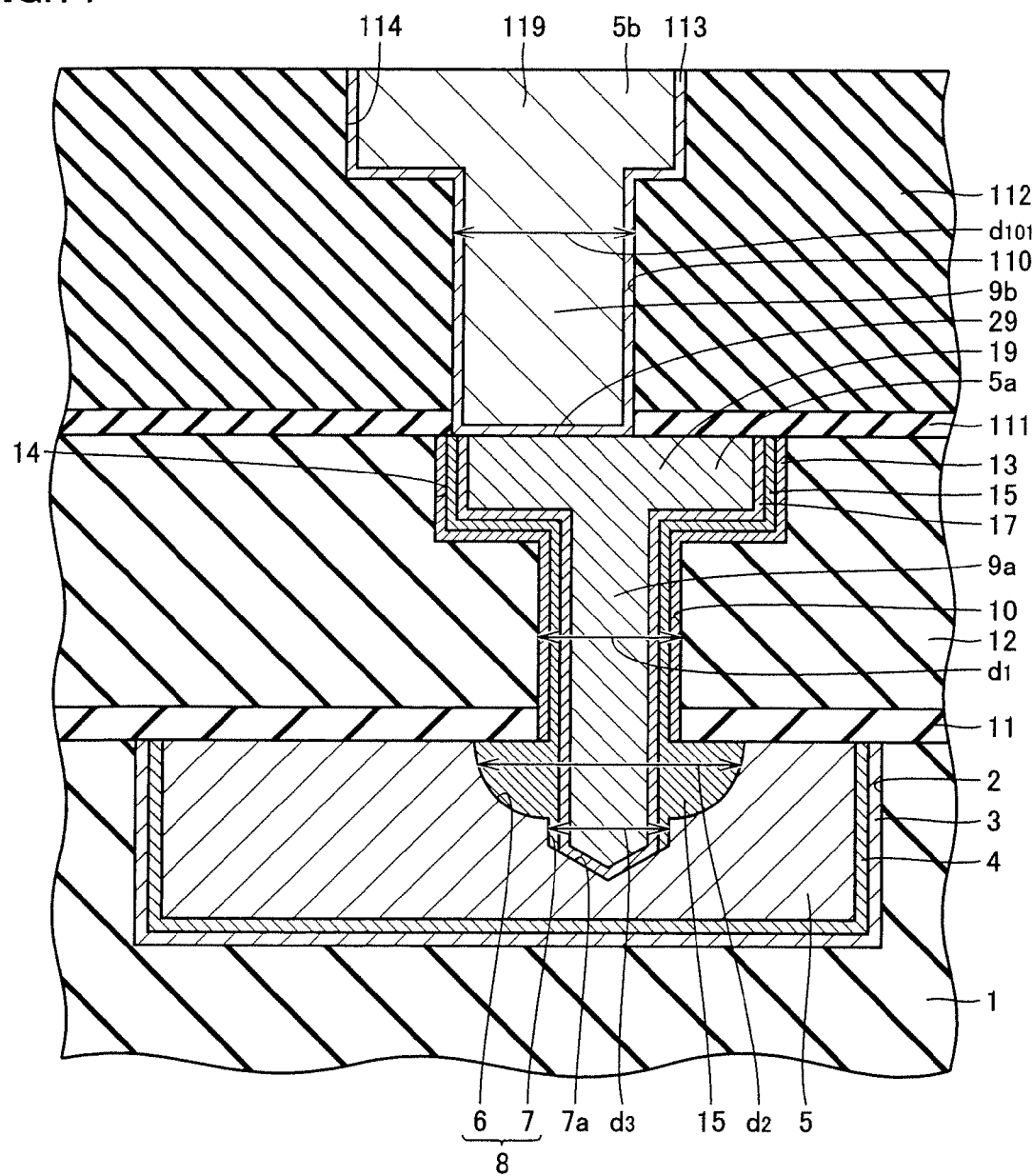
FIG. 14 is a cross section of a structure of a semiconductor device in a fourth embodiment of the present invention.

With reference to FIG. 14, the present embodiment provides a semiconductor device different from that of the first embodiment, as follows: more specifically, Cu film 19 is covered with a liner film 111 deposited on interlayer insulation film 12 and on liner film 111 an interlayer insulation film 112 is deposited. Interlayer insulation film 112 has an upper portion with a trench 114 and in trench 114 and liner film 111 a hole 110 is provided to reach an upper surface 29 of an underlying line 5a. A barrier metal 113 is provided along an internal wall surface and a bottom of trench 114 and those of hole 110. Trench 114 and hole 110 are filled with a Cu film 119.

Cu film 19, barrier metal 17, and conductive film 15 introduced into upper and lower holes 10 and 8 form a contact 9a, and Cu film 19 introduced into trench 14 forms underlying line 5a (a second line). Furthermore, Cu film 119 (a connection layer) filling hole 110 (a hole for the second line) forms a contact 9b, and Cu film 119 filling trench 114 forms a line 5b. In other words, in the present embodiment, underlying line 5 followed by line 5a and then line 5b are sequentially deposited in layers each with insulation film posed therebetween, and underlying line 5 and line 5a are electrically connected by contact 9a and lines 5a and 5b are electrically connected by contact 9b.

Note that contacts 9a and 9b are structurally different. Of upper and lower holes 10 and 8 having contact 9a therein, lower hole 8 is located in underlying line 5. By contrast, hole 110 having contact 9b therein does not extend into line 5a and instead stops at upper surface 29 of line 5a. Furthermore, hole 110 having contact 9b therein has a diameter $d_{101}$ larger than diameter $d_1$ of hole 10 having contact 9a therein.

The present embodiment's semiconductor device includes line 5a, hole 110 reaching line 5a at the top, and Cu film 119 filling hole 110. Hole 110 does not extend into line 5a.

The present embodiment's semiconductor device is effective as follows: a contact large in diameter contacts an underlying line over a large area. As such, it provides a small current density and hardly provides a point initially causing voids in comparison with other contacts. As such, if the contact large in diameter is modified to have such a simple structure as contact 9b, the semiconductor device can still be ensured in reliability. For contact 9b, it is unnecessary to etch line 5a and form a lower hole communicating with hole 110, and the semiconductor device can be fabricated in a simplified process and hence at reduced cost.

Furthermore in the present embodiment's semiconductor device hole 110 can have diameter $d_{101}$ larger than diameter $d_1$ of upper hole 10. As such, if contacts 9a and 9b pass a current of a single magnitude, contact 9b providing a smaller current density can be simplified in structure.

Furthermore in the present embodiment's semiconductor device hole 110 overlies upper hole 10. Normally, an overlying contact provides a smaller current density than an underlying contact, and contact 9b provided in the overlying hole 110 can be simplified in structure.

Note that the hole may not be filled with Cu layer 19 and 119 and instead be filled with a layer of silver (Ag), a layer of an alloy containing Cu and Ag as a main component, or the like.

Fifth Embodiment

Figure 15:
FIG. 15 is a simplified cross section of a semiconductor device in a fifth embodiment of the present invention.
Figure 15:
Figure 15:
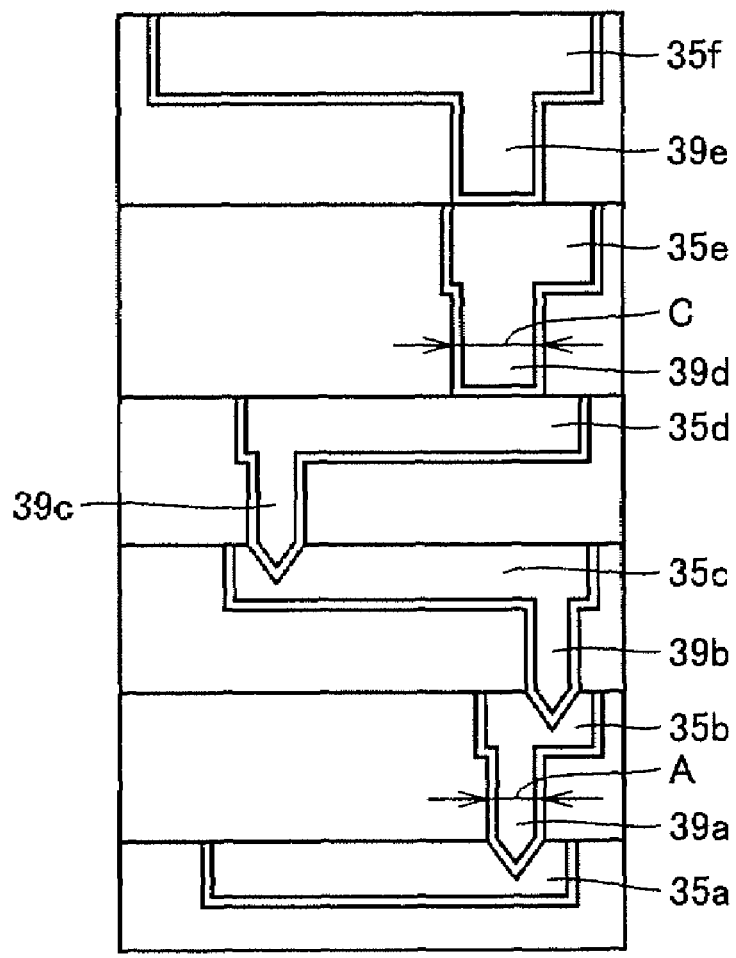

With reference to FIG. 15, the present embodiment provides a semiconductor device including a large number of lines 35a-35f and contacts 39a-39e electrically connecting lines 35a-35f. On line 35a, line 35b is deposited, followed by line 35c, 35d, 35e, 35f, sequentially in layers each with an insulation layer posed therebetween. Lines 35a and 35b are electrically connected by contact 39a. Lines 35b and 35c are electrically connected by contact 39b. Lines 35c and 35d are electrically connected by contact 39c. Lines 35d and 35e are electrically connected by contact 39d. Line 35e and 35f are electrically connected by contact 39e.

Contacts 39a-39e each have a diameter A or a diameter C. Contacts 39a-39c each have diameter A. Contacts 39d and 39e each have diameter C. Diameter C is larger than diameter A.

In the present embodiment, a contact substantially similar in geometry to the FIG. 14 contact 9a and a contact substantially similar in geometry to the FIG. 14 contact 9b are mixed together. More specifically, of contacts 39a-39e, contacts 39a-39c having diameter A are each substantially similar in geometry to contact 9a, and contacts 39d and 39e having diameter C are each substantially similar in geometry to contact 9b.

Figure 16:
FIG. 16 is a simplified cross section of another semiconductor device in the fifth embodiment of the present invention.
Figure 16:
Figure 16:
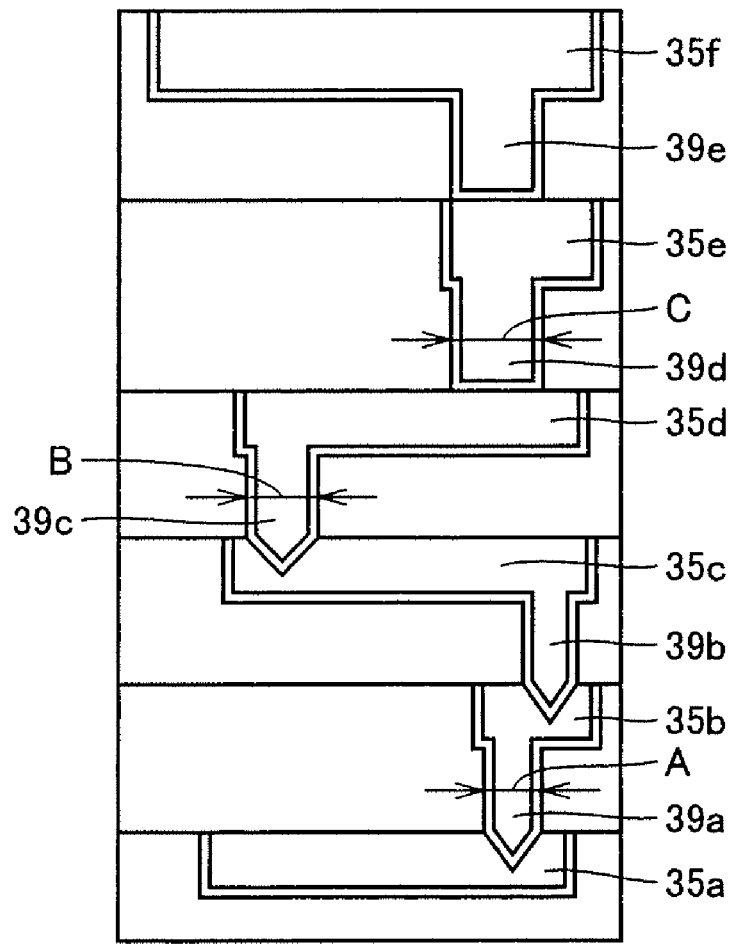

Furthermore, with reference to FIG. 16, contacts 39a-39e each have diameter A, a diameter B, or diameter C. Contacts 39a and 39b each have diameter A. Contact 39c has diameter B. Contacts 39d and 39 each have diameter C. Diameter C is larger than diameter B, and diameter B is larger than diameter A.

In the FIG. 16 structure, of contacts 39a-39e, contacts 39a-39c having diameters A and B are each substantially similar in geometry to contact 9a, and contacts 39d and 39e having diameter C are each substantially similar in geometry to contact 9b.

Furthermore, of contacts 39a-39e, contacts 39a and 39b having diameter A may each be substantially similar in geometry to contact 9a, and contacts 39c-39e having diameters B and C may each be substantially similar in geometry to contact 9b.

Except for the above arrangement, the semiconductor device has a structure substantially similar to that of the FIG. 15 semiconductor device. Accordingly, identical members are identically denoted and will not be described.

As provided in the present embodiment's semiconductor device, if a large number of contacts 39a-39e are provided, each contact having a relatively small diameter can be formed in a geometry substantially similar to contact 9a and each contact having a relatively large diameter can be formed in a geometry substantially similar to contact 9b so that as well as in the fifth embodiment, the semiconductor device can be ensured in reliability and also be fabricated at reduced cost.

While FIG. 15 shows contact 39a-39c having diameter A that have a geometry substantially similar to contact 9a, of the contacts having diameter A the lowermost layer's contact 39a alone may be formed to have a geometry substantially similar to contact 9b.

Furthermore while in the present embodiment a contact having a relatively small diameter underlies that having a relatively large diameter, they may be provided at any position.

Sixth Embodiment

Figure 17:
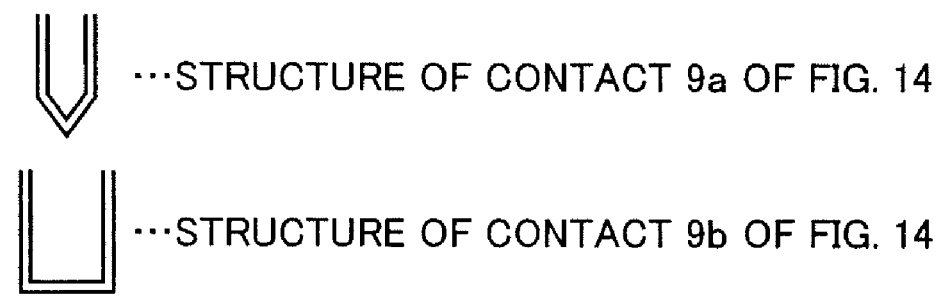
FIG. 17 is a simplified cross section of a semiconductor device in a sixth embodiment of the present invention.
Figure 17:
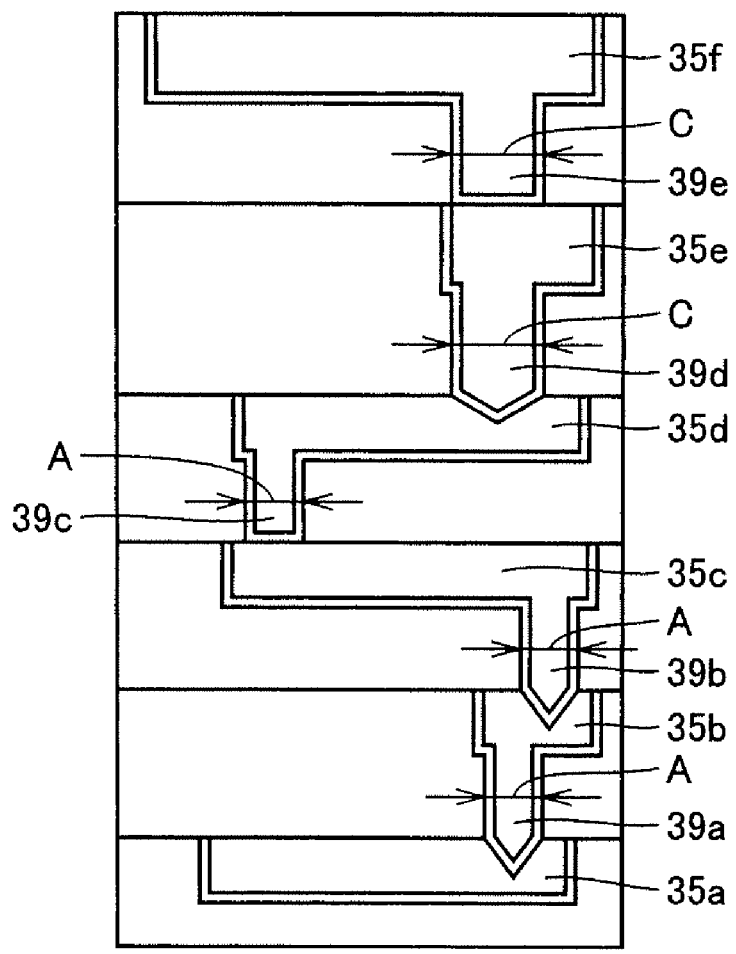

With reference to FIG. 17, contacts 39a-39e have diameter A or C. Contacts 39a-39c each have diameter A and contacts 39d and 39e each have diameter C. Diameter C is larger than diameter A.

In the present embodiment contacts 39a and 39b each passes a current larger in amount than that contact 39c does. As such, even though contacts 39a-39c have the same diameter A, contacts 39a and 39b each provide a current density larger than contact 39c. Similarly, as contact 39d passes a current larger in amount than contact 39e, contact 39d provides a current density larger than contact 39e despite that contacts 39d and 39e have the same diameter C.

Accordingly, of contacts 39a-39e, contacts 39a, 39b and 39d providing a relatively large current density are each adapted to be substantially similar in geometry to contact 9a, whereas contacts 39c and 39e providing a relatively small current density are each adapted to be substantially similar in geometry to contact 9b.

Except for the above arrangement, the semiconductor device is substantially similar to that shown in FIG. 15, and identical members are identically denoted and will not be described.

In a semiconductor device having a large number of lines a current density varies for each contact, and for a contact with a large current density voids are caused more readily than for a contact with a small current density. As such, a line readily breaks. As such if the contact with relatively small current density is formed to have such a simple structure as contact 9b, the semiconductor device is still ensured in reliability. Thus for the contact with relatively small current density a simplified fabrication process can be adopted, and the semiconductor device can be fabricated at reduced cost.

First Example

Hereinafter one example of the present invention will be described.

Figure 18:
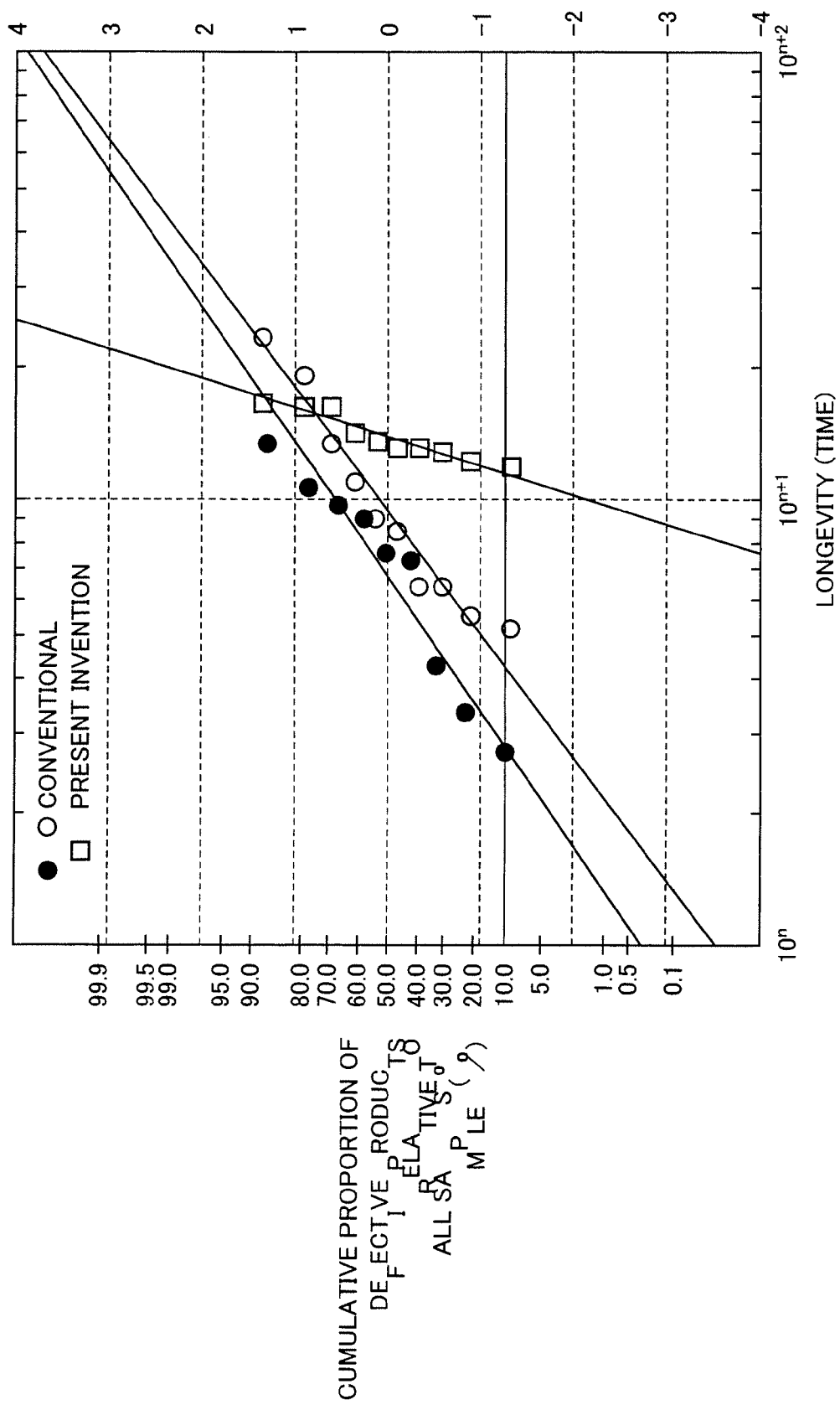
FIG. 18 shows a relationship between life and cumulative defective product proportion.

In the present example, a conventional semiconductor device and the present semiconductor device were compared in reliability. More specifically, a conventional semiconductor device having a via hole formed without etching an underlying line and the present semiconductor device shown in FIG. 1 were compared in longevity. FIG. 8 shows a result thereof. For the conventional semiconductor device, a group of black dots and that of white dots, as shown in FIG. 18, were compared in longevity. A square indicates the present semiconductor device.

As shown in FIG. 18, approximately 50-60% of the entire samples of the conventional semiconductor device had electromigration (EM), stress migration (SM) or similar defect within $10^{n+1}$ hours, and were found to be defective products. In contrast, it can be seen that the present semiconductor device hardly provided defective product even after $10^{n+1}$ hours. It can be understood therefrom that the present semiconductor device can alleviate thermal stress and a current otherwise concentrated at a portion at which a surface of underlying line 5 and a bottom of a conductive film provided in lower hole 8 contact each other, and that the semiconductor device can be increased in reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising;
   a first insulation film;
   a Cu wiring which is provided in said first insulation film and includes copper;
   a second insulation film provided on said first insulation film and said Cu wiring;
   a third insulation film provided on said second insulation film,
   said Cu wiring or said Cu wiring and said first insulation film having a lower hole,
   said second insulation film and said third insulation film having an upper hole communicating with said lower hole, said lower hole being larger in diameter than said upper hole, wherein the lower hole extends underneath the second insulation film;
   a lower conductive film provided at an internal wall surface of said lower hole;
   an upper conductive film provided along an internal wall surface of said upper hole; and
   a conductive film containing copper and filling said upper and lower holes,
   wherein a part of said lower conductive film is provided along an internal wall surface of said upper conductive film,
   wherein said upper conductive film is a barrier metal, and
   wherein said lower conductive film contains a material of said barrier metal and Cu.

2. The semiconductor device according to claim 1, wherein said lower conductive film further contains copper.

3. The semiconductor device according to claim 1, wherein said lower conductive film is not located at a bottom of said lower hole.

4. The semiconductor device according to claim 1, wherein said lower hole penetrates said Cu wiring.

5. The semiconductor device according to claim 1, wherein said barrier metal is a film of at least one selected from a group consisting of tantalum nitride, tantalum silicide, tantalum carbide, titanium nitride, titanium silicide, titanium carbide, tungsten nitride, tungsten silicide, tungsten carbide, ruthenium, and ruthenium oxide.

6. The semiconductor device according to claim 1, further comprising:
an upper Cu wiring including copper;
a hole associated with said upper Cu wiring and reaching said upper Cu wiring at a top portion of said upper Cu wiring; and
a connection layer filling said hole associated with said upper Cu wiring, said hole associated with said upper Cu wiring failing to extend into said upper Cu wiring.

7. The semiconductor device according to claim 6, wherein said hole associated with said upper Cu wiring is larger in diameter than said upper hole.

8. The semiconductor device according to claim 6, wherein said hole associated with said upper Cu wiring overlies said upper hole.

9. A semiconductor device, comprising;
a first insulation film;
a Cu wiring provided in said first insulation film, including copper, and having a lower hole;
a second insulation film provided on said first insulation film and containing nitride;
a third insulation film provided on said second insulation film, said second insulation film and said third insulation film having an upper hole communicating with said lower hole,
wherein the lower hole extends underneath the second insulation film;
a first conductive film provided along an internal wall surface of said upper hole;
a second conductive film provided along an internal wall surface of said first conductive film and within said lower hole; and
a third conductive film containing copper and filling said upper and lower holes,
wherein said first conductive film is a barrier metal including a first material, and
wherein said second conductive film contains said first material and copper.

10. The semiconductor device according to claim 9, further comprising:
an upper Cu wiring including copper;
a hole whose a bottom portion reaches said upper Cu wiring at a top portion of said upper Cu wiring; and
a connection layer filling said hole, said hole failing to extend into said upper Cu wiring,
wherein said hole is larger in diameter than said upper hole, and
wherein said hole overlies said upper hole.

11. The semiconductor device according to claim 9 wherein said first material includes at least one selected from a group consisting of tantalum nitride, tantalum silicide, tantalum carbide, titanium nitride, titanium silicide, titanium carbide, tungsten silicide, tungsten carbide, ruthenium, and ruthenium oxide.

* * * * *